(12) United States Patent
Han et al.

(10) Patent No.: US 8,426,308 B2
(45) Date of Patent: Apr. 23, 2013

(54) METHOD OF FORMING THROUGH SILICON VIA OF SEMICONDUCTOR DEVICE USING LOW-K DIELECTRIC MATERIAL

(75) Inventors: Kyu-hee Han, Hwaseong-si (KR);
Sang-hoon Ahn, Hwaseong-si (KR);
Jang-hee Lee, Yongin-si (KR);
Jong-min Beak, Suwon-si (KR);
Kyoung-hee Kim, Incheon (KR);
Byung-Iyul Park, Seoul (KR);
Byung-hee Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 37 days.

(21) Appl. No.: 13/235,717

(22) Filed: Sep. 19, 2011

(65) Prior Publication Data
US 2012/0094437 A1    Apr. 19, 2012

(30) Foreign Application Priority Data
Sep. 20, 2010   (KR) ..................... 10-2010-0092514

(51) Int. Cl.
*H01L 21/28*   (2006.01)
*H01L 21/44*   (2006.01)
*H01L 23/528*  (2006.01)

(52) U.S. Cl.
USPC ........... 438/639; 438/667; 257/621; 257/698; 257/773; 257/E21.597; 257/E23.174

(58) Field of Classification Search .................. 438/637, 438/639, 667; 257/698, 773, 621, E21.597, 257/E23.174
See application file for complete search history.

(56) References Cited

U.S. PATENT DOCUMENTS

| | | | | |
|---|---|---|---|---|
| 5,481,133 A * | 1/1996 | Hsu | ................................ | 257/621 |
| 6,187,663 B1 * | 2/2001 | Yu et al. | ........................ | 438/624 |
| 6,677,679 B1 * | 1/2004 | You et al. | ....................... | 257/758 |
| 6,707,157 B2 * | 3/2004 | Hoshino | ........................ | 257/773 |
| 6,756,672 B1 * | 6/2004 | You et al. | ....................... | 257/751 |
| 7,265,056 B2 * | 9/2007 | Tsai et al. | ...................... | 438/725 |
| 7,301,107 B2 * | 11/2007 | Karthikeyan et al. | .......... | 174/262 |
| 7,884,016 B2 * | 2/2011 | Sprey et al. | ................... | 438/667 |

(Continued)

FOREIGN PATENT DOCUMENTS
JP    2003-017558    1/2003
JP    2003-297918    10/2003
KR    1020060074976 A    7/2006

*Primary Examiner* — Mary Wilczewski

(74) *Attorney, Agent, or Firm* — Volentine & Whitt, PLLC

(57) ABSTRACT

A method of forming through silicon vias (TSVs) includes forming a primary via hole in a semiconductor substrate, depositing low-k dielectric material in the primary via hole, forming a secondary via hole by etching the low-k dielectric in the primary via hole, in such a manner that a via insulating layer and an inter metal dielectric layer of the low-k dielectric layer are simultaneously formed. The via insulating layer is formed of the low-k dielectric material on sidewalls and a bottom surface of the substrate which delimit the primary via hole and the inter metal dielectric layer is formed on an upper surface of the substrate. Then a metal layer is formed on the substrate including in the secondary via hole, and the metal layer is selectively removed from an upper surface of the semiconductor substrate.

20 Claims, 7 Drawing Sheets

U.S. PATENT DOCUMENTS

| | | | |
|---|---|---|---|
| 8,076,234 B1 * | 12/2011 | Park et al. | 438/622 |
| 8,202,783 B2 * | 6/2012 | Lin et al. | 438/421 |
| 2003/0213617 A1 * | 11/2003 | Karthikeyan et al. | 174/258 |
| 2010/0200989 A1 * | 8/2010 | Sprey et al. | 257/741 |
| 2011/0074044 A1 * | 3/2011 | Lin et al. | 257/776 |
| 2012/0094437 A1 * | 4/2012 | Han et al. | 438/109 |

* cited by examiner

METHOD OF FORMING THROUGH SILICON VIA OF SEMICONDUCTOR DEVICE USING LOW-K DIELECTRIC MATERIAL

CROSS-REFERENCE TO RELATED APPLICATION(S)

This application claims the benefit of Korean Patent Application No. 10-2010-0092514, filed on Sep. 20, 2010, in the Korean Intellectual Property Office.

BACKGROUND

The inventive concept relates to the fabricating of semiconductor devices. More particularly, the inventive concept relates to a method of forming a through silicon via (TSV) (hereinafter referred to as 'TSV') for connecting a plurality of stacked semiconductor chips.

A typical semiconductor package includes a printed circuit board (PCB) as its basic frame, and a semiconductor chip electrically connected to the PCB via wire or bumps. However, these single chip packages offer limited performance and capacity. Therefore, high-performance semiconductor packages have been developed in which semiconductor chips are stacked vertically within the package. In this respect, 3D packaging techniques for mounting chips one atop the other are actively evolving. A Multi-Chip Package (MCP) or a System-In Package (SIP) is an example of a multi-chip package using a 3D packaging technique. In one 3D packaging technique, vertically stacked semiconductor chips are electrically connected to one another via through silicon via (TSVs) instead of wires or bumps.

TSVs minimize the length of the path along which signals are transmitted to/from a chip in the stack, thereby allowing the bandwidth of the semiconductor package to be maximized. Accordingly, a semiconductor package having chips connected by TSVs possesses excellent electrical characteristics and has a relatively small footprint. Accordingly, it would be desirable to form more stable TSVs to improve a 3D packaging technique.

SUMMARY

There is provided a method of forming a TSV using low-k dielectric material.

The method may be used in the fabricating of a semiconductor device, according to one aspect of the inventive concept. First, a semiconductor substrate is provided. The semiconductor substrate is etched to form a primary via hole in an upper surface of the substrate. Then a conformal layer of low-k dielectric material is formed on the substrate as extending contiguously into the primary via hole and over the upper surface of the substrate. The layer of low-k dielectric material is selectively etched to remove some of the material from the primary via hole while leaving low-k dielectric material on the upper surface of the substrate. Thus, a via insulating layer and an inter metal dielectric layer of low-k dielectric material are simultaneously formed. The via insulating layer is formed on surfaces that delimit sides and the bottom of the primary via hole such that the via insulating layer delimits a secondary via hole within the primary via hole. The inter metal dielectric layer is formed on the upper surface of the semiconductor substrate. Next, a metal layer is formed on the semiconductor substrate including within the secondary via hole. The metal layer is then removed from the upper surface of the semiconductor substrate.

The method may also be used to fabricate a multi-chip package according to another aspect of the inventive concept. At least one semiconductor chip is fabricated as described above.

That is, a semiconductor substrate is provided. The semiconductor substrate is etched to form a primary via hole in an upper surface of the substrate. Then a conformal layer of low-k dielectric material is formed on the substrate as extending contiguously into the primary via hole and over the upper surface of the substrate. The layer of low-k dielectric material is selectively etched to remove some of the material from the primary via hole while leaving low-k dielectric material on the upper surface of the substrate. Thus, a via insulating layer and an inter metal dielectric layer of low-k dielectric material are simultaneously formed. The via insulating layer is formed on surfaces that delimit sides and the bottom of the primary via hole such that the via insulating layer delimits a secondary via hole within the primary via hole. The inter metal dielectric layer is formed on the upper surface of the semiconductor substrate. Next, a metal layer is formed on the semiconductor substrate including within the secondary via hole. The metal layer is then removed from the upper surface of the semiconductor substrate, thereby leaving a metal via contact in the secondary hole.

In addition, a backside polishing process that abrades the semiconductor substrate is performed until a bottom portion of the via insulating layer is removed and the via contact is exposed.

The semiconductor chip so formed is stacked with at least one other semiconductor chip and the chips are electrically connected in the stack by means of the via contact.

BRIEF DESCRIPTION OF THE DRAWINGS

The inventive concept will be more clearly understood from the following detailed description taken in conjunction with the accompanying drawings in which.

DETAILED DESCRIPTION OF THE PREFERRED EMBODIMENTS

Figure 1:
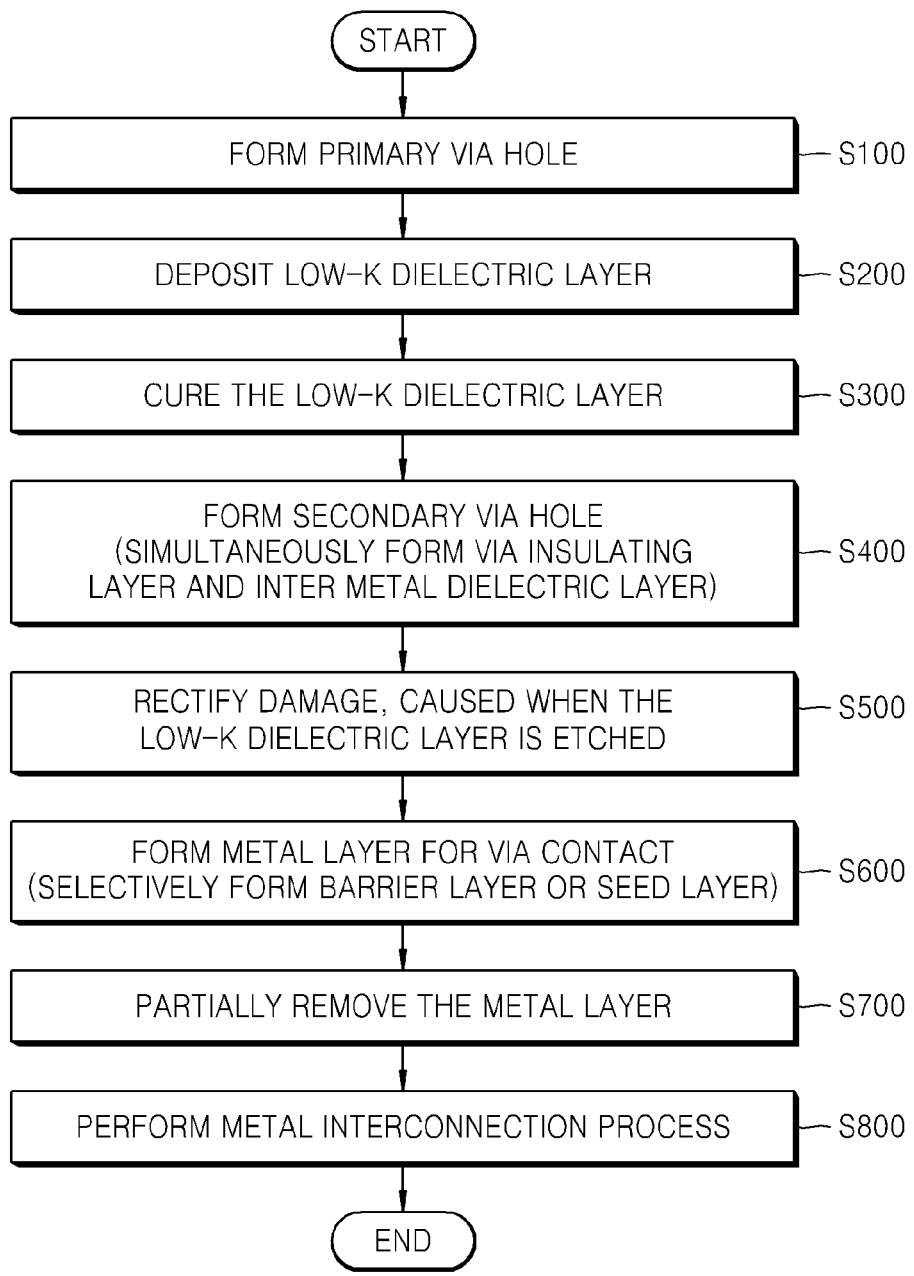
FIG. 1 is a flowchart illustrating an embodiment of a method of forming TSVs using a low-k material, according to the inventive concept.

Various embodiments and examples of embodiments of the inventive concept will be described more fully hereinafter with reference to the accompanying drawings. In the drawings, the sizes and relative sizes and shapes of elements and layers and regions shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, all technical terms are to be given their meaning as understood by those skilled in the art. Furthermore, the terms "comprises" or "comprising" when used in this specification specifies the presence of stated features or processes but does not preclude the presence or additional features or processes.

A method of forming a semiconductor device, e.g., a chip, having TSVs according to the inventive concept, will now be described in general referring to the flowchart of FIG. 1.

First, a primary via hole is formed on a semiconductor substrate (operation S100). Next, a low-k dielectric layer is deposited on the semiconductor substrate (operation S200). The low-k dielectric layer may be formed in such a manner that the primary via hole is filled with the low-k dielectric layer and an upper surface of the semiconductor substrate is covered by the low-k dielectric layer. Next, the low-k dielectric layer is cured so as to reduce the dielectric constant thereof (operation S300). Next, a secondary via hole is formed by applying a hard mask on the semiconductor substrate having the low-k dielectric layer and etching the low-k dielectric in the primary via hole using the hard mask as an etch mask (operation S400). The secondary via hole is thus formed to be smaller than the primary via hole. Accordingly, it is possible to simultaneously form a via insulating layer of the low-k dielectric layer on the sidewalls and bottom surface (on which TSVs are to be formed) of the primary via hole, and an inter metal dielectric layer of the low-k dielectric layer on the semiconductor substrate.

The via insulating layer and the inter metal dielectric layer formed of the low-k dielectric layer reduce a resistive capacitive (RC) delay in a metal interconnection, caused by a parasitic capacitance generated in a semiconductor chip in which TSVs are formed. Also, since the via insulating layer and the inter metal dielectric layer are formed simultaneously, a method of fabricating a semiconductor device is more simplified than when the inter metal dielectric layer is formed separately.

The via insulating layer may be formed according to a Reactive Ion Etching (RIE) process, and may thus have a smoother surface than when it is formed according to a separate Chemical Vapor Deposition (CVD) process (hereinafter referred to as 'CVD process'). Thus, the step coverage of the via insulating layer may be improved.

Next, a process of restoring damages, caused when the low-k dielectric layer is etched by performing, for example, thermal curing, Ultra-Violet (UV) ray curing, or Infrared-Ray (IR) curing (operation S500). Next, a metal layer for via contact is deposited in the secondary via hole (operation S600). Before the metal layer is deposited, a barrier layer or a seed layer may be selectively formed on the via insulating layer. Then, the metal layer on the semiconductor substrate may be partially removed according to a Chemical Mechanical Polishing (CMP) process (operation S700). Thereafter, a metal interconnection process may be performed to extend plugs formed on the semiconductor substrate to the outside (operation S800).

A practical example of the method of forming TSVs using a low-k material, according to the inventive concept, will now be described with reference to FIGS. 2 to 8.

Figure 2:
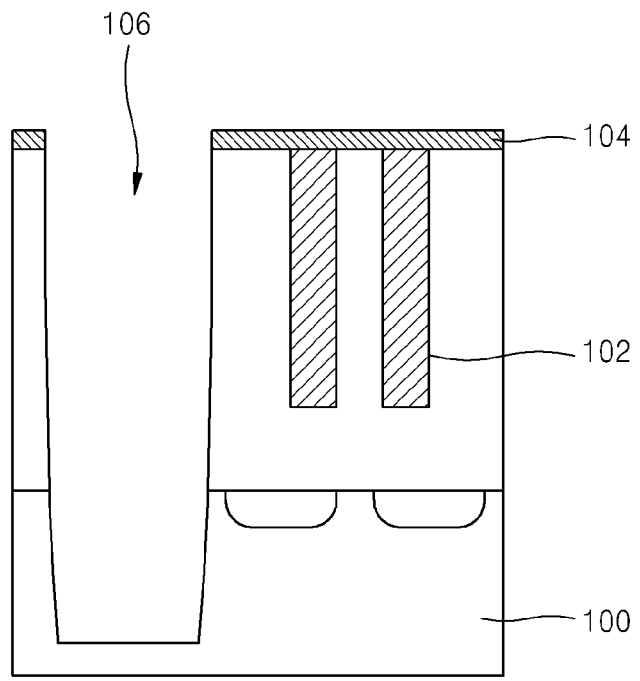
FIGS. 2 to 9 are cross-sectional views illustrating an embodiment of a method of forming TSVs using a low-k material, according to the inventive concept.

Referring to FIG. 2, a semiconductor substrate 100 having an integrated circuit (not shown) and plugs 102 therein is provided. The integrated circuit may constitute a memory device, a complementary metal oxide semiconductor (CMOS) image sensor, a logic device, or a controller, i.e., may perform any of various operations. Although not shown in the drawings, the plugs 102 are connected to connection terminals of the integrated circuit below the plugs 102 and serve as vertical wires extending to the exterior of the package to allow the integrated circuit to be electrically connected to an external device.

Next, a buffer layer 104 is formed on the semiconductor substrate 100. The buffer layer 104 may be a silicon nitride layer (SiN). Next, a primary via hole 106 is formed by etching a region of the semiconductor substrate 100. A backside polishing of the semiconductor substrate 100 may be performed after the primary via hole 106 is formed. Thus, the primary via hole 106 may be easily formed to a relatively great depth in the region of the semiconductor substrate 100, in which the integrated circuit is formed. That is, the primary via hole 106 may extend to a level beneath that at which the integrated circuit is formed.

Figure 3:
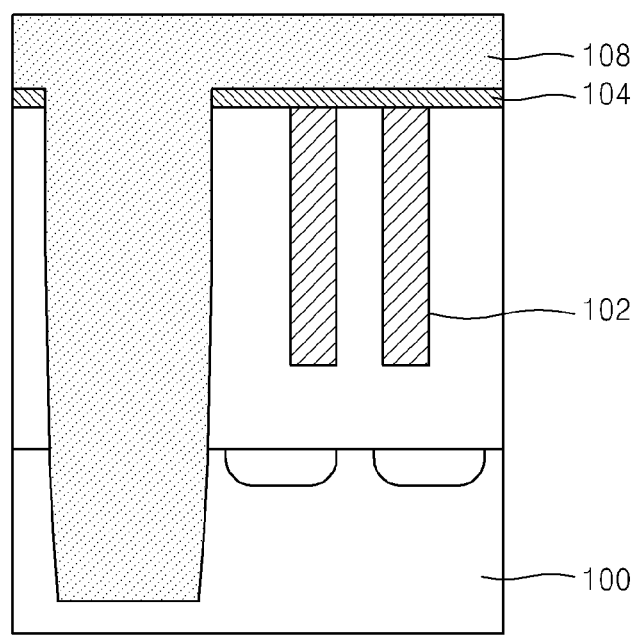

Referring to FIG. 3, a low-k dielectric layer 108 is then formed on the semiconductor substrate 100. A low-k dielectric is a material whose dielectric constant is less than or equal to 3.5, that is, is lower than that of silicon oxide ($SiO_2$). In an example of this embodiment, the low-k dielectric layer 108 is an SiOCH layer formed of organosilicate glass (OSG) having about 1 to 30% of carbon. SiOCH is an Si—C—O—H compound. Hydrogen (H) or carbon (C) atom have low electric polarization and thus, a thin film containing many hydrogen (H) or carbon (C) atoms has a low dielectric constant. Also, the dielectric constant of SiOCH can be reduced even further, as is known per se, when pores are formed therein by thermal curing or UV ray curing.

However, other various insulating materials having a dielectric constant of 2.0 to 3.5 can be used instead of SiOCH. For example, the low-k dielectric layer may be a fluorine-added oxide layer (SiOF), a layer of an organic molecular fluorine resin (PTFF), or a layer of porous Hydrogen Silses-Quioxane (HSQ) which is a hydrogen-containing Spin-On Glass (SOG).

The low-k dielectric layer 108 may be formed by depositing low-k material dielectric in liquid form using Spin-On Deposition (SOD) or a Flowable Chemical Vapor Deposition (FCVD) process other than Atmospheric Pressure CVD (APCVD). SOD or FCVD are each a process in which deposition material can be thoroughly deposited, i.e., without voids, into fine gaps. Hence, the low-k dielectric fills the primary via hole 106 in the semiconductor substrate 100.

Subsequently, a process of lowering the dielectric constant of the low-k dielectric layer 108 may be performed. The process selected to this end depends on the characteristics of the low-k dielectric layer 108. This process, as alluded to above, may be thermal curing or UV ray curing in the case in which the low-k dielectric layer 108 is a layer of SiOCH. The thermal curing or UV curing may be performed at 450° C. or less for less than one hour under an oxygen atmosphere or an inert gas atmosphere.

Figure 4:
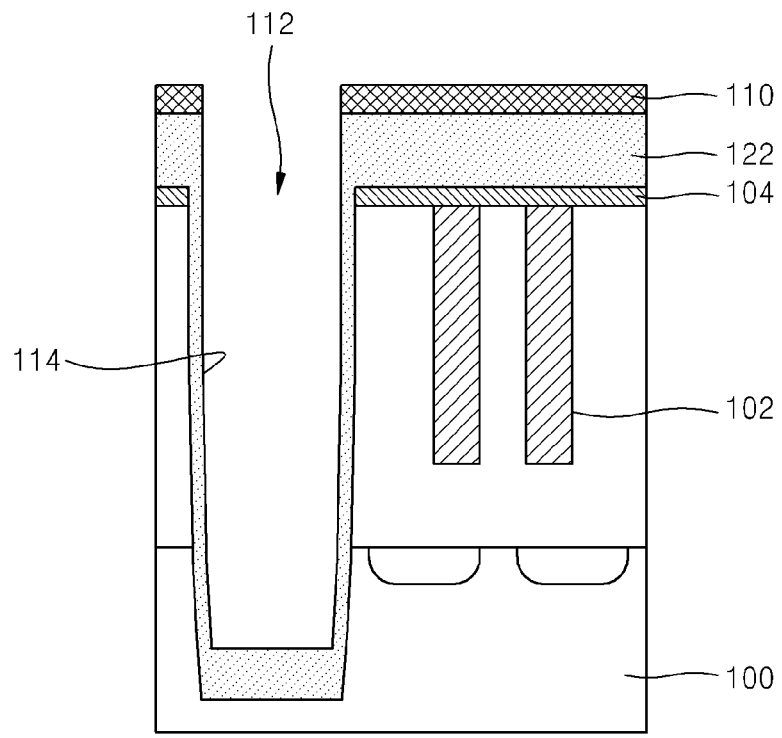

Referring to FIG. 4, a hard mask 110 is then formed over the low-k dielectric layer 108 on the semiconductor substrate 100. The hard mask 110 may be made up of at least one of a metal layer such as a layer of TiN, an oxide layer, and a nitride layer. Then, a secondary via hole 112 is formed by etching the low-k dielectric layer 108 within the primary via hole 106 using a reactive ion etching (RIE) process in which the hard mask 110 serves as an etch mask.

Figure 8:
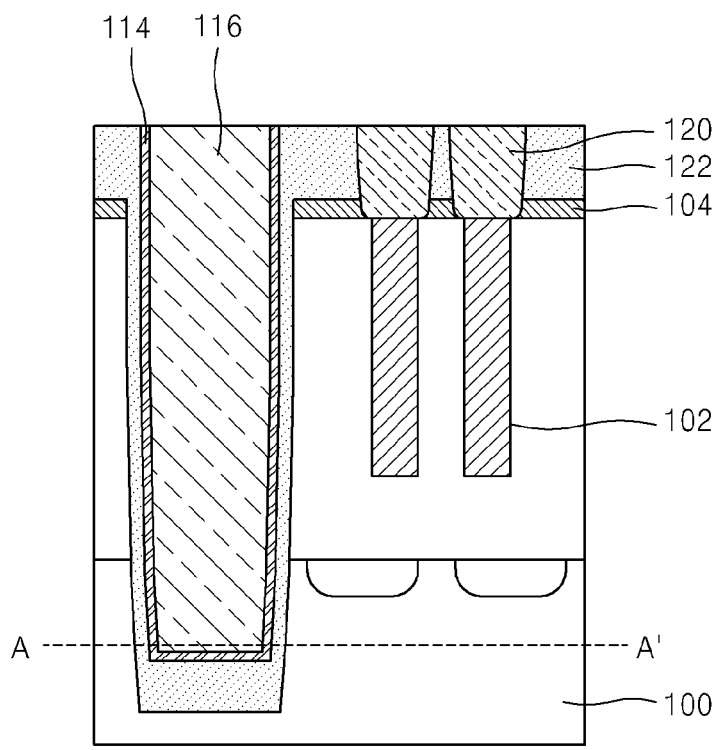

The secondary via hole 112 is formed in this way so as to be smaller and, more specifically, to be narrower and more shallow than the primary via hole 106. Also, the secondary via hole 112 is formed in alignment with the primary via hole 106. Accordingly, a via insulating layer 114 formed of the low-k dielectric layer 108 remains on the sidewalls and bottom surface (of the substrate 100) which delimit the primary via hole 106. At the same time, an inter metal dielectric layer 122 formed of the low-k dielectric layer 108 remains on the semiconductor substrate. The inter metal dielectric layer 122, as will be described later on with reference to FIG. 8, is used to facilitate the forming of metal interconnections for the plugs 102. In this case, the via insulating layer 114 may be formed in such a manner that the portion of the layer 114 formed along the bottom of the primary via hole 106 is thicker than the portion of the layer 114 formed along the sidewalls of the primary via hole 106.

The via insulating layer 114 and the inter metal dielectric layer 122 formed of the low-k dielectric layer 108 minimize an RC delay of such a metal interconnection, otherwise caused by parasitic capacitance generated in the semiconductor substrate 100 in which TSVs are formed. Also, the via insulating layer 114 and the inter metal dielectric layer 122 are formed simultaneously. That is, this embodiment does not require a subsequent process of forming the inter metal dielectric layer 122. Accordingly, the process is relatively simple and hence, cost-effective. This contrasts to a case in which the via insulating layer is formed by APCVD because in such a case, the via insulating layer in the primary via hole would be thin and hence, an additional inter metal dielectric layer would have to be subsequently formed.

Also, as mentioned above, in this embodiment, the insulating layer 114 is formed by RIE. Therefore, the insulating layer 114 has a smoother surface than if it were formed by APCVD. Moreover, the via insulating layer 114 has better step coverage than if it were formed by APCVD.

Next, damage to the via insulating layer 114 and the inter metal dielectric layer 122, caused by the etching of the low-k dielectric layer 108, may be rectified. In particular, substances adsorbed onto the via insulating layer 114 and the inter metal dielectric layer 122 during the RIE process may be removed by carrying out a thermal curing, UV ray curing, and/or IR curing process.

Also, the damage may be rectified by increasing the carbon content of the low-k via insulating layer 114. Specifically, a carbon-containing precursor may be ion-implanted into the via insulating layer 114 and the inter metal dielectric layer 122, and the resultant structure may be thermally processed under an oxygen atmosphere or an inert gas atmosphere.

Figure 5:
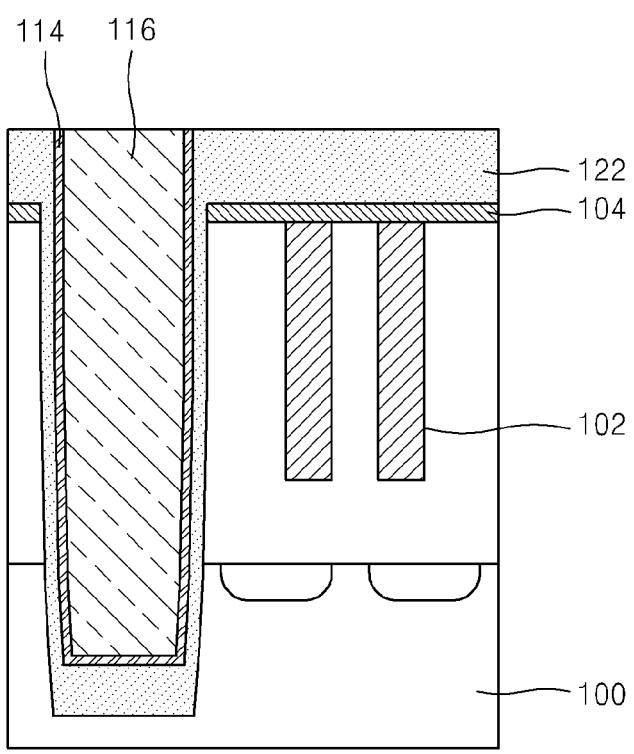

Referring to FIG. 5, a metal layer 116 is formed on the semiconductor substrate 100 top such a thickness that the secondary via hole 112 is filled with metal. The metal layer may be formed of copper (Cu) or tungsten (W), i.e., a metal having low resistance. Also, a barrier layer (not shown) may be formed within the secondary via hole 112 before the secondary via hole 112 is filled with metal. In this case, the barrier layer may be formed of at least one layer of material selected from the group consisting of Ta, TaN, Ru, Co, Mn, TiN, Ti/TiN, WN, Ni, and NiB.

In one example of this embodiment, the metal layer is formed by forming a seed layer of copper on the via insulating layer 114 (directly thereon or atop the barrier layer) and selectively growing the seed layer. Then, CMP is performed on the semiconductor substrate 100 to remove some of the resulting metal layer from the upper surface of the semiconductor substrate 100, such that the remainder of the metal layer forms a via contact 116. Note, the inter metal dielectric layer 122 may act as a polishing stop layer during the CMP process.

Figure 6:
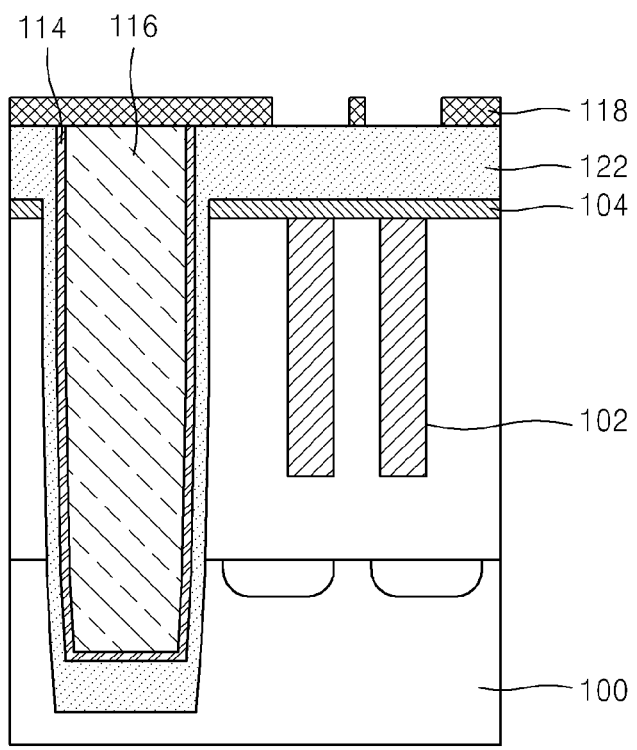
Figure 7:
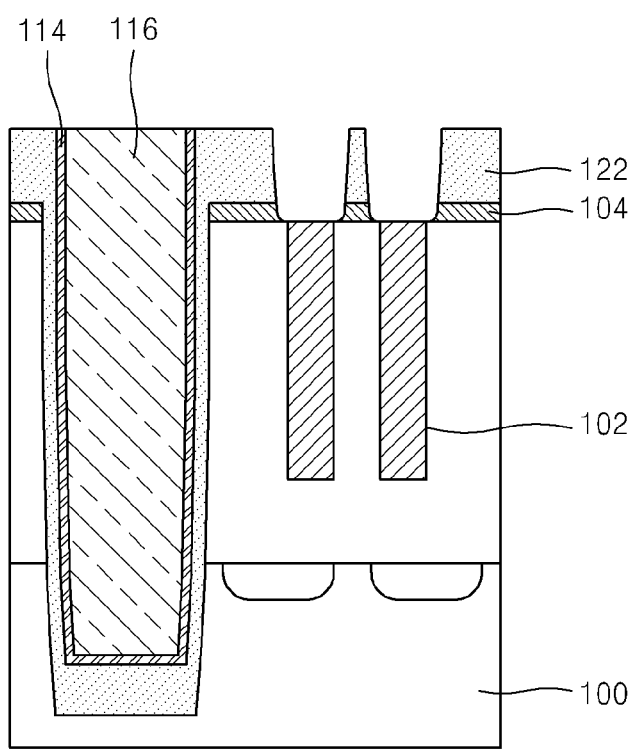

Referring to FIGS. 6 to 8, a mask 118, e.g., a photoresist pattern, is then formed on the semiconductor substrate 100. Next, the plugs 102 are exposed as illustrated in FIG. 7 by etching the inter metal dielectric layer 122 and the buffer layer 104 using the mask 118 as an etch mask to form openings in the inter metal dielectric layer 122 and buffer layer 104. Next, metal interconnections 120 are formed as connected to the plugs 102, respectively, by filling the openings in the inter metal dielectric layer 122 and the buffer layer 104 with copper (Cu). That is, the metal interconnections 120 are formed by a damascene process. Next, the backside of the semiconductor substrate 100 may be polished (abraded) to remove the bottom of the via insulating layer 114, which process is represented by line A-A' of FIG. 8 showing the endpoint of the backside polishing process. The resulting via contact 116 may be used for electrically connecting other semiconductor chips (not shown) stacked with the chip of this structure.

Figure 9:
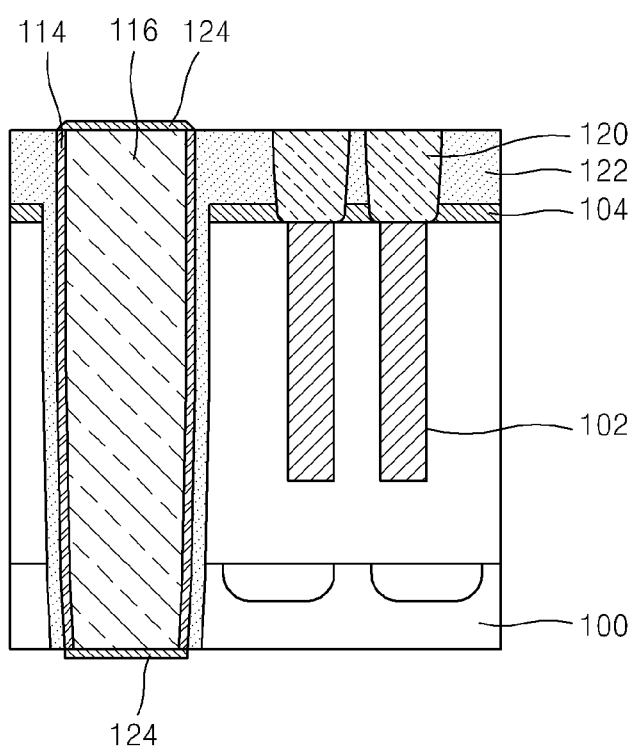

FIG. 9 illustrates an additional process of forming a bump 124 on the via contact 116 which facilitates a connection to a semiconductor chip (not shown) stacked on the chip of this structure. The bump 124 may be a solder bump.

Figure 10:
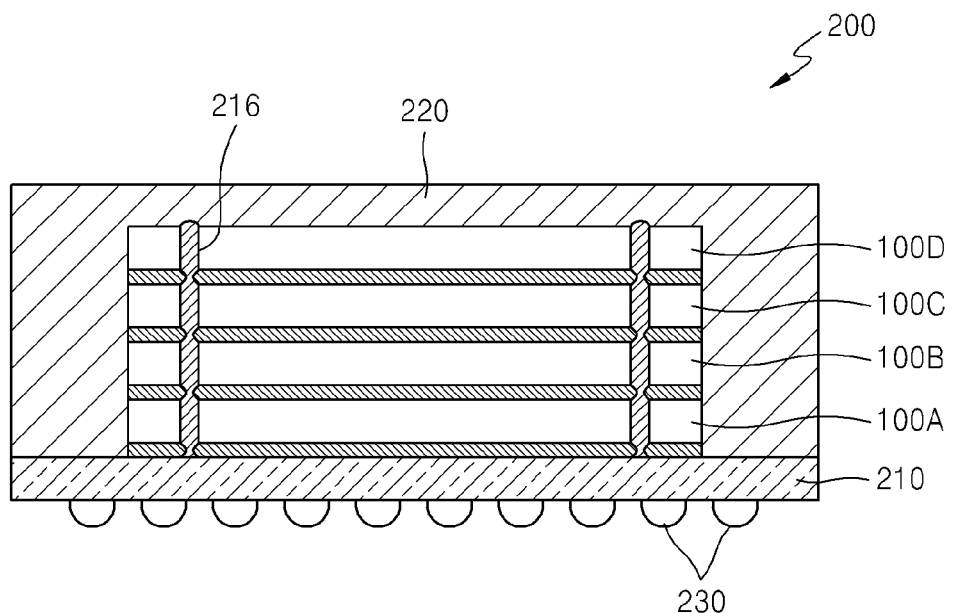
FIG. 10 is a cross-sectional view of an embodiment of a multi-chip package fabricated according to the inventive concept.

FIG. 10 shows an example of a stacked type of multi-chip package 200 that includes semiconductor chips fabricated as shown in and described with reference to FIGS. 2-9, according to the inventive concept. Of course, other configurations of a multi-chip package comprising one or more chips fabricated according to the inventive concept are possible.

Referring to FIG. 10, the multi-chip package 200 of this example has four semiconductor chips 100A, 100B, 100C, and 100D vertically stacked on a substrate 210. The semiconductor chips 100A, 100B, 100C, and 100D are connected vertically by via contacts 216 and bumps (not shown). In this case, the semiconductor chips 100A, 100B, 100C, and 100D each have via insulating layers and inter metal dielectric layers of low-k dielectric material, fabricated according to the processes shown in and described with reference to FIGS. 2-4, such that the low-k dielectric material has excellent step coverage. Thus, an RC delay in the stacked structure of semiconductor chips 100A, 100B, 100C, and 100D is minimal.

The package 200 also has an encapsulating material 220 formed on the substrate 210 and sealing the semiconductor chips 100A, 100B, 100C, and 100D. Conductive external terminals, e.g., solder balls 230, may be disposed on a bottom surface of the substrate 210 of semiconductor package. The substrate 210 has vias by which the external terminals are electrically connected to the via contacts 216 of chip 100A.

Figure 11:
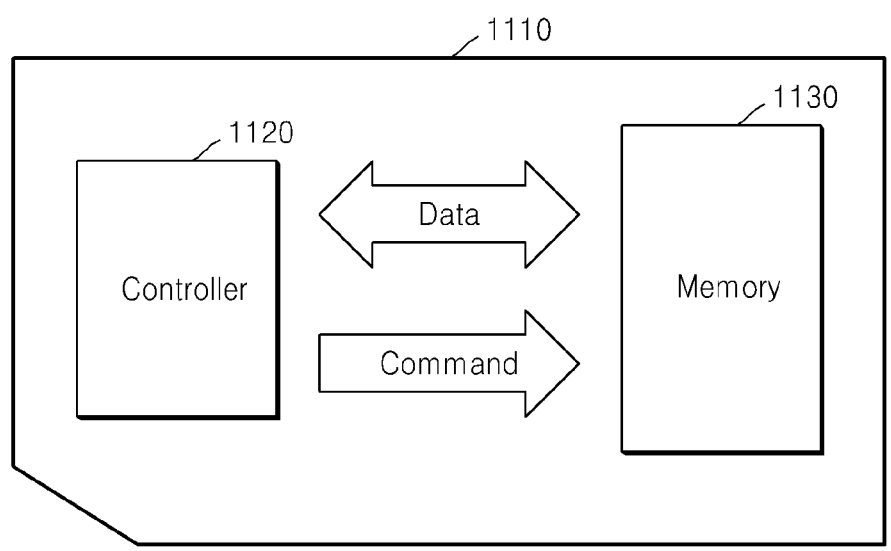
FIGS. 11 and 12 are block diagrams of electronic devices that may include a semiconductor device having TSVs formed of a low-k material, according to the inventive concept.
Figure 12:
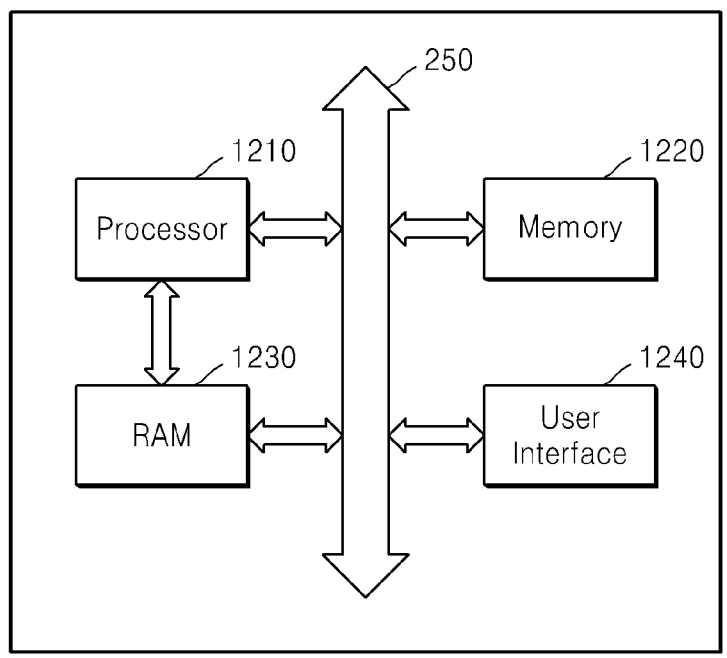

FIGS. 11 and 12 are block diagrams of electronic devices each including a semiconductor device having TSVs formed of low-k dielectric material, according to the inventive concept.

Specifically, FIG. 11 is a block diagram of a card including a controller 1120 and a memory device 1130 housed in a card body 1110. The controller 1120 and the memory device 1130 exchange data and command signals. In particular, the memory device 1130 and the controller 1120 may exchange data with each other according to a command signal issued by the controller 1120. Thus, the card may store the data in the memory device 1130 or may output the data stored in the memory device 1130 to the outside.

In this example of an electronic device, the memory device 1130 is a multi-chip package that includes a stacked structure of semiconductor chips, in which TSVs are formed using low-k material according to the inventive concept. The card may be used as a data storage card for various portable devices. Examples of such a card include multimedia (MMC) and secure digital (SD) cards.

Referring to FIG. 12, this example of an electronic device is an electronic system of a mobile device or a computer. The electronic system includes a processor 1210, a memory system 1220, a random access memory (RAM) 1230, and a user interface unit 1240. The processor 1210, the memory system 1220, the RAM 1230, and the user interface unit 1240 communicate with one another via a bus 1250. The processor 1210 may run a program and control the electronic system. The user interface unit 1240 is used to input data to or output data from the electronic system 1200. The memory system 1220 may store code for operating the processor 1210, data processed by the processor 1210, or data received from the outside. The memory system 1220 may include a controller and a memory device, and may have a structure similar to that of the card of FIG. 11. The electronic system may be employed by various electronic devices such as portable game consoles, portable notebooks, MP3 players, navigators, Solid State Disk (SSD), automobiles, or household appliances. The RAM 1230 may be used as operating memory of the processor 1210. In an example of this system, the processor 1210 and the RAM 1230 are packaged together in the form of a System-In Package (SIP) or a Multi-Chip Package (MCP) including at least one chip having TSVs fabricated according to the inventive concept. Accordingly, an RC delay occurring in the electronic system is minimal such that the electronic system may offer excellent performance.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method for use in fabricating a semiconductor device, the method comprising:
   providing a semiconductor substrate;
   etching a semiconductor substrate to form a primary via hole in an upper surface of the substrate;
   forming a layer of low-k dielectric material that extends into the primary via hole and covers the upper surface of the substrate;
   selectively etching the layer of low-k dielectric material to remove some of the material from the primary via hole and leave low-k dielectric material on the upper surface of the substrate, thereby simultaneously forming a via insulating layer of low-k dielectric material on surfaces that delimit sides and the bottom of the primary via hole, and an inter metal dielectric layer of low-k dielectric material on the upper surface of the semiconductor substrate, wherein the via insulating layer delimits a secondary via hole within the primary via hole;
   form a metal layer on the semiconductor substrate including within the secondary via hole; and
   removing the metal layer from the upper surface of the semiconductor substrate.

2. The method of claim 1, further comprising lowering the dielectric constant of the low-k dielectric material after the via insulating layer and inter metal dielectric layer have been simultaneously formed.

3. The method of claim 2, wherein the lowering the dielectric constant of the low-k dielectric layer comprises thermally curing the low-k dielectric material or curing the low-k dielectric material with ultraviolet (UV) rays.

4. The method of claim 3, wherein the curing is performed at 450° C. or less in an oxygen or inert gas atmosphere.

5. The method of claim 1, wherein the layer of low-k dielectric material is formed of SiOCH containing about 1 to 30% of carbon.

6. The method of claim 1, wherein the layer of low-k dielectric material is formed so as to have a dielectric constant of about 2.0 to 3.5.

7. The method of claim 1, wherein the layer of low-k dielectric material is formed by spin-on deposition or flowable chemical vapor deposition.

8. The method of claim 1, wherein the forming of the secondary via hole comprises forming a hard mask on the layer of low-k dielectric material, and etching the layer using the hard mask as an etch mask.

9. The method of claim 1, further comprising performing a process of rectifying damage to the via insulating layer and the inter metal dielectric layer, caused by the etching of the low-k dielectric material in the primary via hole.

10. The method of claim 9, wherein the process of rectifying damage to the via insulating layer and the inter metal dielectric layer comprises a process of removing substances adsorbed by the low-k dielectric material.

11. The method of claim 10, wherein the process of removing the substances adsorbed by the low-k dielectric material comprises thermally curing the via insulating layer and the inter metal dielectric layer, curing the via insulating layer and the inter metal dielectric layer with UV rays, or curing the via insulating layer and the inter metal dielectric layer with infrared-rays (IR).

12. The method of claim 9, wherein the process of rectifying damage to the via insulating layer and the inter metal dielectric layer comprises a process of increasing the carbon content of the low-k dielectric material.

13. The method of claim 1, further comprising forming a barrier layer in the secondary via hole before the metal layer is formed.

14. The method of claim 13, wherein the barrier layer is formed of at least one material selected from the group consisting of Ta, TaN, Ru, Co, Mn, TiN, Ti/TiN, WN, Ni, and NiB.

15. The method of claim 1, wherein the via insulating layer is formed in such a manner that a bottom portion of the via insulating layer delimiting the bottom of the secondary via hole is thicker than a portion of the via insulating layer delimiting sides of the secondary via hole.

16. The method of claim 1, wherein the semiconductor substrate provided has an internal metal plug whose end is exposed at the upper surface of the substrate, the layer of low-k dielectric material is formed to cover the exposed end of the metal plug, and the selective etching of the layer of low-k dielectric material leaves the inter metal interconnection layer over the end of the metal plug, further comprising etching the inter metal interconnection layer to form an opening therethrough that exposes the metal plug, and filling the opening with electrically conductive material to form a conductive interconnection.

17. A method of fabricating a multi-chip semiconductor device package, comprising:
   forming a semiconductor chip by:
   providing a semiconductor substrate,
   etching the semiconductor substrate to form a primary via hole in an upper surface of the substrate, forming a contiguous layer of low-k dielectric material that extends into the primary via hole and covers the upper surface of the substrate, selectively etching the layer of low-k dielectric material to remove some of the material from the primary via hole and leave low-k dielectric material on the upper surface of the substrate, thereby simultaneously forming a via insulating layer of low-k dielectric material on surfaces that delimit sides and the bottom of the primary via hole, and an inter metal dielectric layer of low-k dielectric material on the upper surface of the semiconductor substrate, wherein the via insulating layer delimits a secondary via hole within the primary via hole, form a metal layer on the semiconductor substrate including within the secondary via hole, removing the metal layer from the upper surface of the semiconductor substrate to form a via contact of metal in the secondary hole, and performing a backside polishing process that abrades the semiconductor substrate until a bottom portion of the via insulating layer is removed and the via contact is exposed, whereby a via contact that is exposed at a bottom surface of the semiconductor substrate is formed; and stacking the semiconductor chip with at least one other semiconductor chip and electrically connecting the chips by means of the via contact.

18. The method of claim 17, wherein the formed semiconductor chip is stacked atop the at least one other semiconductor chip.

19. The method of claim 17, wherein the semiconductor chips are mounted to a printed circuit board with the formed semiconductor chip as the lowest chip in the stack and electrically connected to the printed circuit board by means of the via contact, further comprising encapsulating the stack of semiconductor chips on the printed circuit board.

20. The method of claim 17, wherein the semiconductor substrate provided has an internal metal plug whose end is exposed at the upper surface of the substrate, the layer of low-k dielectric material is formed to cover the exposed end of the metal plug, and the selective etching of the layer of low-k dielectric material leaves the inter metal interconnection layer over the end of the metal plug, further comprising etching the inter metal interconnection layer to form an opening therethrough that exposes the metal plug, and filling the opening with electrically conductive material to form a conductive interconnection.

* * * * *